United States Patent
Lo et al.

(10) Patent No.: US 7,585,754 B2
(45) Date of Patent: Sep. 8, 2009

(54) METHOD OF FORMING BONDING PAD OPENING

(75) Inventors: Wen-Shun Lo, Hsinchu County (TW); Chih-Jung Ni, Hsinchu (TW); Yi-Tung Lin, Taipei County (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 11/972,303

(22) Filed: Jan. 10, 2008

(65) Prior Publication Data

US 2009/0181542 A1   Jul. 16, 2009

(51) Int. Cl.
*H01L 21/00* (2006.01)
*H01L 29/40* (2006.01)

(52) U.S. Cl. .................. 438/585; 438/653; 438/99; 438/612; 257/758

(58) Field of Classification Search .............. 438/597, 438/782, 612, 231, 99; 257/758, 306
See application file for complete search history.

(56) References Cited

U.S. PATENT DOCUMENTS

| | | | | |
|---|---|---|---|---|
| 5,172,212 A | | 12/1992 | Baba | |
| 5,225,372 A | * | 7/1993 | Savkar et al. | 438/653 |
| 5,930,664 A | * | 7/1999 | Hsu et al. | 438/612 |
| 6,006,764 A | | 12/1999 | Chu et al. | |
| 6,221,752 B1 | | 4/2001 | Chou et al. | |
| 6,355,576 B1 | * | 3/2002 | Haley et al. | 438/745 |
| 7,413,924 B2 | * | 8/2008 | Weston et al. | 438/99 |
| 7,456,062 B1 | * | 11/2008 | En et al. | 438/231 |
| 2005/0191832 A1 | * | 9/2005 | Huang et al. | 438/585 |
| 2006/0163640 A1 | * | 7/2006 | Park et al. | 257/306 |
| 2006/0261484 A1 | * | 11/2006 | Farrar | 257/758 |
| 2008/0248640 A1 | * | 10/2008 | Gu et al. | 438/585 |

* cited by examiner

*Primary Examiner*—William M Brewster
*Assistant Examiner*—Wilner Jean Baptiste
(74) *Attorney, Agent, or Firm*—J.C. Patents

(57) ABSTRACT

A method of forming a bonding pad opening is provided. A passivation layer and a mask layer are sequentially formed on a substrate having a bonding pad formed thereon. Thereafter, the passivation layer is etched to form an opening with use of an anti-reflection coating (ARC) layer of the bonding pad as an etching stop layer. Next, a dry removal process is performed to remove the mask layer. Afterwards, a wet cleaning process is performed to remove the residual mask layer or a polymer produced by previous manufacturing processes. Thereafter, the ARC layer is removed through performing an etching process with use of the passivation layer as a hard mask layer, so as to form the bonding pad opening.

20 Claims, 4 Drawing Sheets

METHOD OF FORMING BONDING PAD OPENING

BACKGROUND OF THE INVENTION

1. Field of the Invention

The present invention relates to a method of fabricating semiconductor devices. More particularly, the present invention relates to a method of forming a bonding pad opening.

2. Description of Related Art

After semiconductor devices are completely fabricated, an uppermost metal layer is usually patterned to form a bonding pad, and a passivation layer is covered thereon. After that, a bonding pad opening is formed in the passivation layer, and subsequent package processes are then implemented. Nevertheless, pittings arisen from the corrosion of metals are frequently generated on upper surfaces of the semiconductor devices before the package processes are performed. In addition, during an etching process, polymer by-products formed at sidewalls of the bonding pad opening may not be completely removed in some cases. The residual polymers are likely to contaminate a testing apparatus in the subsequent package processes. Besides, corrosive gases may also be released due to a rising temperature during the operation of integrated circuits. Accordingly, in order to ensure reliability, the removal of the polymer by-products generated during the etching process has always been an important research topic.

In U.S. Pat. No. 5,930,664, a method for preventing corrosion of aluminum bonding pads after a passivation layer/an anti-reflection coating (ARC) layer etching is provided. Said patent discloses a formation of polymers in the last step of etching the passivation layer, so as to protect the aluminum bonding pads from being corroded because of an exposure to moisture. However, an important issue of removing the residual polymers remains unresolved in said patent.

In U.S. Pat. No. 6,006,764, a method of stripping photoresist from aluminum bonding pads that prevent corrosion is disclosed. In the patent, after a passivation layer is etched, a wet cleaning process is implemented to clean a wafer, and then the wafer is moved to a reactive ion etching station, so as to remove residual chlorine with use of plasma generated by a fluorine-containing gas. Finally, the wafer is moved to a photoresist asher for performing an oxygen ashing treatment. Nevertheless, the wafer of said patent is first cleaned through the wet cleaning process, and thereby a significant amount of the photoresist may remain if a solution with extremely large polarity is not employed, resulting in contamination of the station in subsequent processes.

In U.S. Pat. No. 6,221,752, a method of mending erosion of a bonding pad is provided. In the patent, a passivation layer is completely etched, and an eroded part of the bonding pad is then removed. Thereafter, an oxide layer is formed subsequently on a clean surface exposed by the removed part of the bonding pad. However, said patent is actually directed to a repairing method rather than a preventive measure.

In U.S. Pat. No. 6,355,576, a method for cleaning integrated circuit bonding pads is provided. In the patent, plasma having $CF_4$ and water vapor combination is adopted to treat the bonding pads after a passivation layer is completely etched. The plasma having the water vapor is able to evaporate fluorine residue on the bonding pads, while the $CF_4$ plasma is capable of removing polymers to a great extent. Next, photoresist is ashed with use of oxygen plasma, and a wet cleaning process is then performed. However, the issue regarding the fluoridized bonding pads remains unsolved in the patent.

In U.S. Pat. No. 5,172,212, a semiconductor device is provided with an improved bonding pad. In said patent, after a bonding pad opening is formed but before a photoresist layer is removed, a metal barrier layer is formed on the bonding pad exposed by the bonding pad opening. Next, the photoresist layer is removed, and a wire-bonding process is then implemented. However, said patent does not propose any method of cleaning the bonding pad. Moreover, as the metal barrier layer is sputtered, the high out gassing level of photoresist and photoresist scumming arisen from the sputtering process may result in contamination. On the other hand, when the metal layer serving as the bonding pad is patterned, no ARC layer is formed on the metal layer. Accordingly, accuracy of a photolithography process may be affected, giving rise to deviations of critical dimensions.

SUMMARY OF THE INVENTION

The present invention is directed to a method of forming a bonding pad opening. The method is capable of reducing polymer by-products generated during an etching process.

The present invention is further directed to a method of forming a bonding pad opening. The method is capable of removing polymers generated during an etching process.

The present invention is further directed to a method of forming a bonding pad opening. The method is capable of preventing corrosion of metals.

The present invention is further directed to a method of forming a bonding pad opening. The method is capable of improving realibility.

The present invention provides a method of forming a bonding pad opening. In the method, a substrate is firstly provided. A bonding pad including a conductive layer and an ARC layer has been formed on the substrate. Next, a passivation layer is formed over the substrate to cover the bonding pad. Thereafter, a mask layer is formed on the passivation layer. Here, the mask layer has a first opening exposing the passivation layer. After that, the passivation layer is etched to form a second opening with use of the ARC layer as an etching stop layer. A dry removal process is then performed to remove the mask layer. Afterwards, a wet cleaning process is performed to remove the residual mask layer or polymers produced in previous manufacturing processes. Finally, the ARC layer exposed by the second opening is etched and removed with use of the passivation layer and the conductive layer as a hard mask layer and the etching stop layer, respectively, so as to form the bonding pad opening.

In order to the make the aforementioned and other objects, features and advantages of the present invention comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
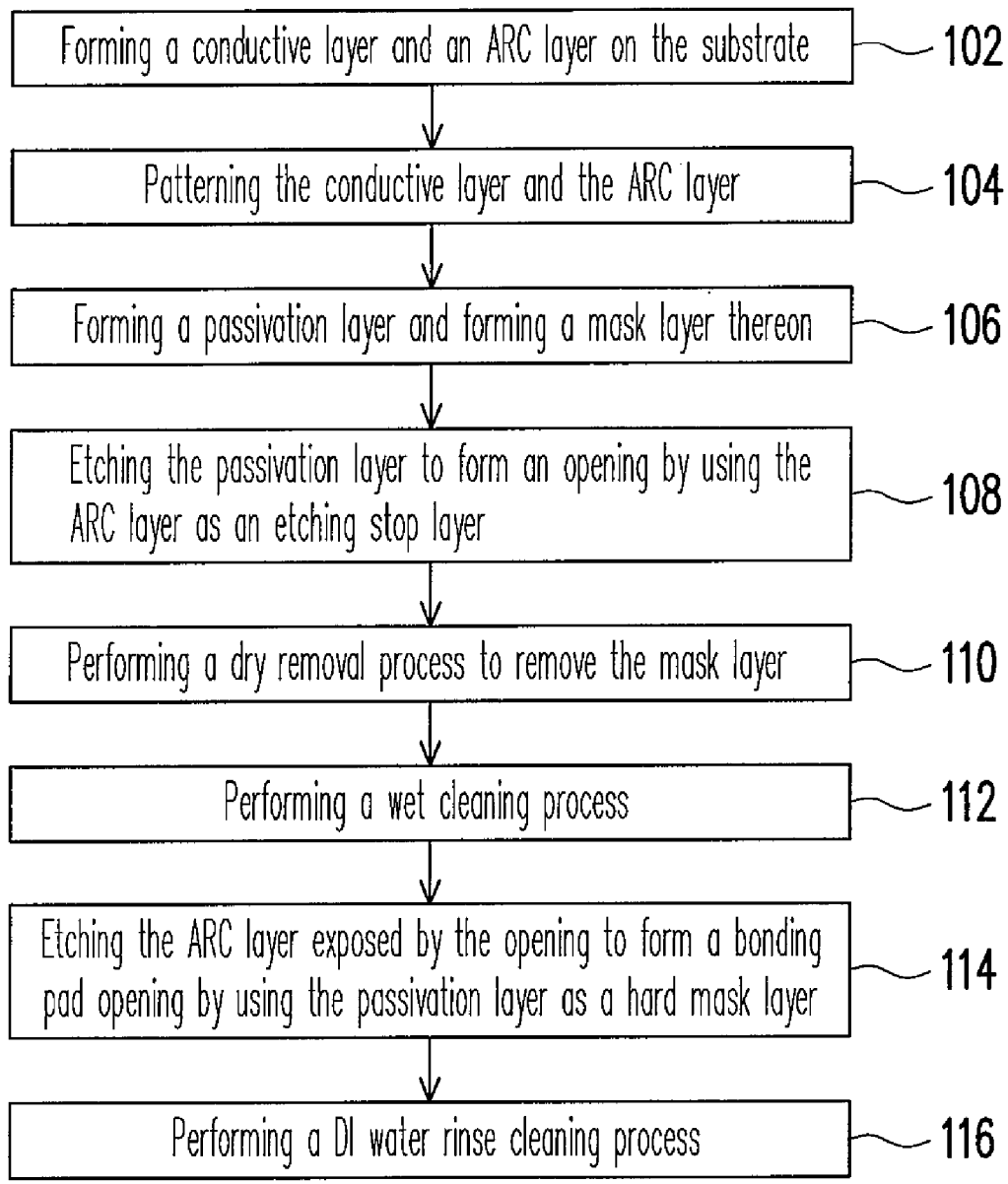
FIG. 1 is a flowchart illustrating a method of forming a bonding pad opening according to an embodiment of the present invention.

FIG. 1 is a schematic flowchart illustrating the method of manufacturing a semiconductor device according to an embodiment of the present invention. FIGS. 2A through 2F are schematic cross-sectional flowcharts illustrating a method of manufacturing the semiconductor device according to the embodiment of the present invention.

Figure 2A:
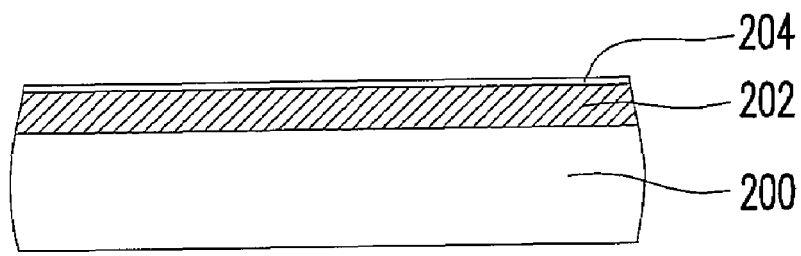
FIGS. 2A through 2F are schematic cross-sectional flowcharts illustrating the method of forming the bonding pad opening according to the embodiment of the present invention.

Referring to FIGS. 1 and 2A, in step 102, a substrate 200 is provided. A conductive layer 202 and an ARC layer 204 are formed on the substrate 200. A material of the conductive layer 202 includes aluminum, such as an aluminum silicon alloy, an aluminum copper alloy, or an aluminum silicon copper alloy. On the other hand, a material of the ARC layer 204 is selected from the group consisting of Ti, TiN, TiW, and the combination thereof. In order to prevent the ARC layer 204 from being etched through during a subsequent process of etching a passivation layer, a thickness of the ARC layer 204 in the present invention is approximately 1⅓ to 2 times of that of the ARC layer provided in the related art. In one embodiment, the ARC layer 204 is Ti/TiN with the thickness of 50 Å/800 Å.

Figure 2B:
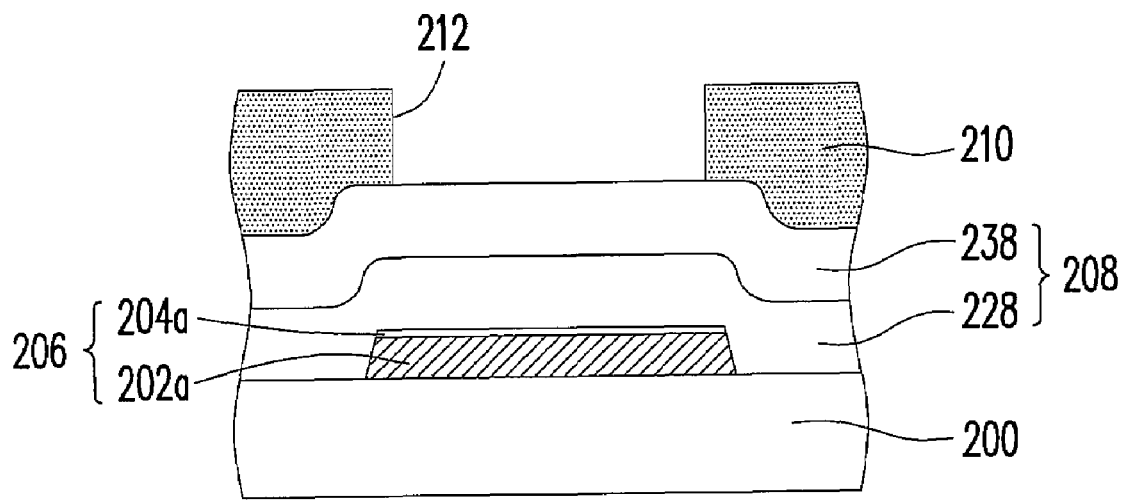

After that, referring to FIGS. 1 and 2B, steps 104 and 106 are implemented. After a photolithography process and an etching process are performed, a patterned conductive layer 202a and an ARC layer 204a are formed and together constitute a bonding pad 206. Then, a passivation layer 208 is formed over the substrate 200. A material of the passivation layer 208 is selected from the group consisting of a high-density plasma (HDP) silicon oxide layer, an ultraviolet (UV) silicon nitride layer, a plasma-enhanced silicon nitride layer, borosilicate glass (BSG), phosphorus silicon glass (PSG), boron phosphorous silicon glass (BPSG), a tetra-ethyl-orthosilicate (TEOS) silicon oxide layer using the TEOS as a reactive gas, and the combination thereof. In one embodiment, the passivation layer 208 is constituted by an HDP silicon oxide layer 228 and a UV silicon nitride layer 238.

Next, step 106 is carried out. A mask layer 210 having an opening 212 is formed on the passivation layer 208 and exposes the passivation layer 208. The mask layer 210 is a photoresist layer, for example.

Figure 2C:
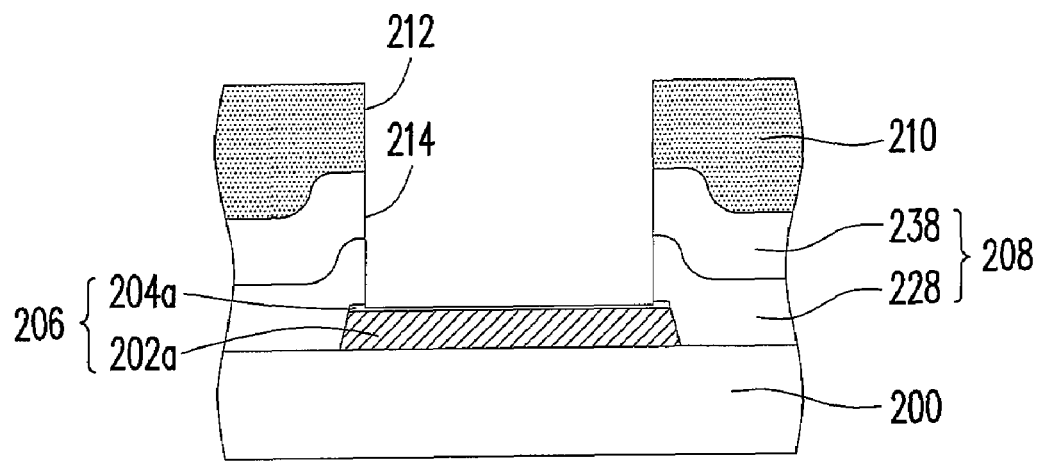

Thereafter, referring to FIGS. 1 and 2C, step 108 is implemented. The passivation layer 208 is etched to form an opening 214 with use of the ARC layer 204a as an etching stop layer. A method of etching the passivation layer 208 is, for example, an anisotropic etching method, such as a dry etching method. In the dry etching method, a fluorine-containing gas can be adopted. The fluorine-containing gas is selected from the group consisting of $CF_4$, $CHF_3$, $C_2F_6$, $C_3F_8$, $C_4F_8$, $SF_6$, and the combination thereof. Aside from the fluorine-containing gas, another gas selected from the group consisting of hydrogen, argon, oxygen and the combination thereof can be further introduced to perform the etching process. During the etching process, an over-etching step can be implemented, so as to ensure that no residual protection layer 208 remains below the opening 212. On the other hand, in the process of etching the protection layer 208, the ARC layer 204a is used as the etching stop layer with a sufficient thickness. Accordingly, the conductive layer 202a below the ARC layer 204a is not exposed, and thereby a bottom of the opening 214 and sidewalls thereof are unlikely to expose the conductive layer 202a and the ARC layer 204a at the same time. Therefore, an electrochemical exchange reaction of dissimilar metals, which is caused by exposing the conductive layer and the ARC layer at the same time, can be prevented.

Figure 2D:
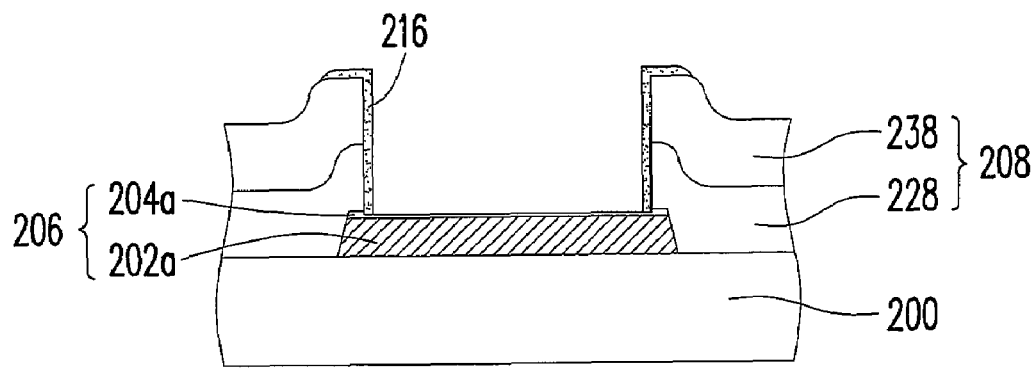

After that, referring to FIGS. 1 and 2D, step 110 is performed. A dry removal process is performed to remove the mask layer 210. As the mask layer 210 is the photoresist layer, oxygen plasma having no fluoride is adopted to perform an ashing step on the mask layer 210. The oxygen plasma have no fluorides including fluorinated hydrocarbon, such as $CF_4$, and thus the ARC layer 204a can be prevented from being etched by fluorine-containing compounds.

During the etching process of the passivation layer 208, the ARC layer 204a is not completely removed. Hence, although the production of the polymers is inevitable, the polymers generated by said etching process are much less than those generated when the passivation layer is etched and the ARC layer are simultaneously removed according to the related art. Additionally, in the process of removing the mask layer 210, the polymers are also formed on the sidewalls of the opening 214 and a surface thereof. Here, a polymer 216 is taken as the polymer generated in the previous manufacturing processes.

Figure 2E:
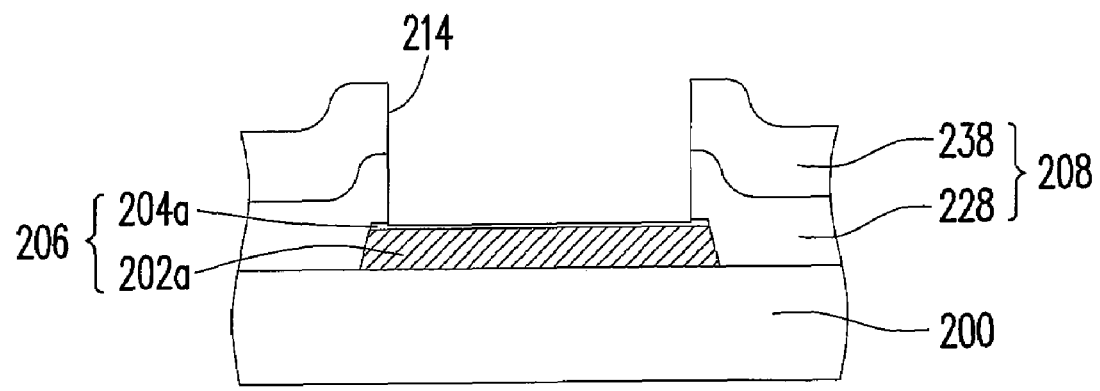

Afterwards, referring to FIGS. 1 and 2E, a wet cleaning process 112 is performed to remove the residual mask layer 210 or the polymer 216 produced by the previous manufacturing processes. Here, an organic alkaline solvent or a diluted acid solution which is not likely to etch the ARC layer 204a is utilized for performing the wet cleaning process 112. According to an embodiment, the ARC layer 204a is Ti/TiN, and a relatively inexpensive acid solution can be employed to perform the wet cleaning process 112. Here, the inexpensive acid solution is, for example, a diluted mixture of sulfuric acid and hydrogen peroxide, or the organic alkaline solvent including alcohol amine, hydroxyl amine, or dihydroxybenzene.

Figure 2F:
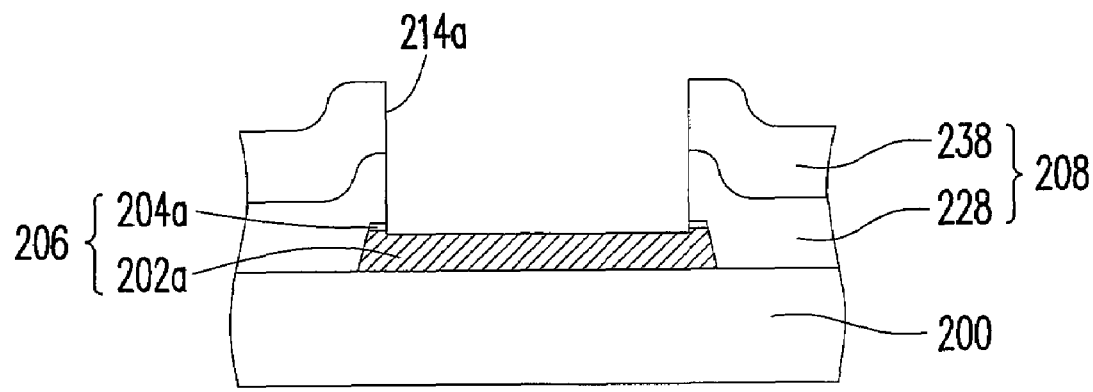

Thereafter, referring to FIGS. 1 and 2F, step 114 is implemented. The ARC layer 204a exposed by the opening 214 is etched and removed with use of the passivation layer 208 and the conductive layer 202a as a hard mask layer and the etching stop layer, respectively, so as to form a bonding pad opening 214a exposing the conductive layer 202a. The ARC layer 204a can be removed by using a chlorine-containing plasma in an etching station. A gas adopted by the chlorine-containing plasma is selected from the group consisting of $Cl_2$, $BCl_3$, or the combination thereof. Besides, another gas further adopted by the chlorine-containing plasma is selected from the group consisting of $CHF_3$, argon, nitrogen, and the combination thereof. After the ARC layer 204a is etched and removed by using the chlorine-containing plasma, residual chlorine is removed with use of $H_2O$ plasma in situ in the etching station without releasing vacuum, so as to prevent the conductive layer 202a from being corroded after the vacuum state is released. Next, in step 116, a deionized (DI) water rinse process can be performed to further remove trace chlorine which is likely to remain. A thickness of the passivation layer 208 serving as the hard mask layer is reduced in the etching process. In one embodiment, the passivation layer 208 is constituted by the HDP silicon oxide layer 228 and the UV silicon nitride layer 238. After the etching process is completed, a thickness of the UV silicon nitride layer 238 is reduced by 500 Å approximately. Thus, the possibly-reduced thickness of the passivation layer 208 can be compensated in advance when the previous process of depositing the passivation layer 208 is implemented.

In light of the foregoing, the method of forming the bonding pad according to the present invention is quite easy. Moreover, said method is not only able to effective reduce an amount of the polymers, but also capable of completely removing the polymers, such that the bonding pad can be prevented from being corroded during the etching process. In conclusion, said method provided by the present invention can improve reliability in an effective manner.

What is claimed

1. A method of forming a bonding pad opening, the method comprising:

providing a substrate having a bonding pad formed thereon, the bonding pad comprising a conductive layer and an anti-reflection coating (ARC) layer;

forming a passivation layer over the substrate to cover the bonding pad;

forming a mask layer on the passivation layer, the mask layer having a first opening exposing the passivation layer;

etching the passivation layer to form a second opening with use of the ARC layer as an etching stop layer;

performing a dry removal process to remove the mask layer;

performing a wet cleaning process to remove the residual mask layer or a polymer produced by previous manufacturing processes; and after performing the dry removal process and performing the wet cleaning process, etching and removing the ARC layer exposed by the second opening with use of the passivation layer and the conductive layer as a hard mask layer and the etching stop layer, respectively, so as to form the bonding pad opening.

2. The method of claim 1, wherein the mask layer comprises a photoresist layer.

3. The method of claim 2, wherein the step of performing the dry removal process comprises performing an oxygen plasma ashing process.

4. The method of claim 3, wherein a gas employed in the oxygen plasma ashing process comprises no fluorine compound.

5. The method of claim 3, wherein a gas employed in the oxygen plasma ashing process comprises no $CF_4$.

6. The method of claim 1, wherein a material of the ARC layer is titanium/titanium nitride (Ti/TiN) with a thickness of 50Å/800Å approximately.

7. The method of claim 1, wherein the step of removing the ARC layer exposed by the second opening comprises etching and removing the ARC layer in an etching station with use of chlorine-containing plasma.

8. The method of claim 7, wherein the chlorine-containing plasma employs a gas selected from the group consisting of $Cl_2$, $BCl_3$, and the combination thereof.

9. The method of claim 8, wherein the chlorine-containing plasma further employs a gas selected from the group consisting of $CHF_3$, argon, nitrogen, and the combination thereof.

10. The method of claim 7, further comprising removing residual chlorine with use of $H_2O$ plasma in situ in the etching station without releasing vacuum after the ARC layer is etched and removed by using the chlorine-containing plasma.

11. The method of claim 10, further comprising performing a deionized water rinse process.

12. The method of claim 1, wherein an organic alkaline solvent or a diluted acid solution is utilized for performing the wet cleaning process.

13. The method of claim 12, wherein the diluted acid solution comprises a mixture of sulfuric acid and hydrogen peroxide.

14. The method of claim 12, wherein the organic alkaline solvent comprises alcohol amine, hydroxylamine, or dihydroxybenzene.

15. The method of claim 1, wherein the passivation layer is constituted by a dual-layered material layer.

16. The method of claim 15, wherein a material of the dual-layered material layer is selected from the group consisting of a high-density plasma (HDP) silicon oxide layer, an ultraviolet silicon nitride layer, a plasma-enhanced silicon nitride layer, borosilicate glass (BSG), phosphorus silicon glass (PSG), boron phosphorous silicon glass (BPSG), a tetra-ethyl-ortho-silicate (TEOS) silicon oxide layer, and the combination thereof.

17. The method of claim 1, wherein the method of etching the passivation layer comprises performing a plasma etching process with use of a fluorine-containing gas.

18. The method of claim 17, wherein the fluorine-containing gas is selected from the group consisting of $CF_4$, $CHF_3$, $C_2F_6$, $C_3F_8$, $C_4F_8$, $SF_6$, and the combination thereof.

19. The method of claim 17, wherein the plasma etching process further comprises etching the passivation layer with use of a gas selected from hydrogen, argon, oxygen, and the combination thereof.

20. The method of claim 1, wherein a material of the conductive layer comprises an aluminum silicon alloy, an aluminum copper alloy, or an aluminum silicon copper alloy.

* * * * *